United States Patent
Houdebine et al.

(10) Patent No.: US 8,766,683 B2
(45) Date of Patent: Jul. 1, 2014

(54) DOUBLE OUTPUT LINEARIZED LOW-NOISE CHARGE PUMP WITH LOOP FILTER AREA REDUCTION

(71) Applicant: ST-Ericsson SA, Plan-les-Ouates (CH)

(72) Inventors: Marc Houdebine, Crolles (FR); Julien Kieffer, Grenoble (FR); Sebastien Rieubon, Saint-Jean-de-Moirans (FR)

(73) Assignee: ST-Ericsson SA, Plan-les-Ouates (CH)

(*) Notice: Subject to any disclaimer, the term of this patent is extended or adjusted under 35 U.S.C. 154(b) by 0 days.

(21) Appl. No.: 13/946,411

(22) Filed: Jul. 19, 2013

(65) Prior Publication Data

US 2014/0049304 A1 Feb. 20, 2014

Related U.S. Application Data

(60) Provisional application No. 61/696,332, filed on Sep. 4, 2012.

(30) Foreign Application Priority Data

Aug. 17, 2012 (EP) ..................... 12306009

(51) Int. Cl.
*H03L 7/18* (2006.01)
*H03L 7/093* (2006.01)

(52) U.S. Cl.
USPC .......................................... 327/156; 327/147

(58) Field of Classification Search
CPC .......... H03L 7/0891; H03L 7/18; H03L 7/093
USPC .................................................. 327/147, 156
See application file for complete search history.

(56) References Cited

U.S. PATENT DOCUMENTS

| | | | |
|---|---|---|---|
| 6,617,832 B1 * | 9/2003 | Kobayashi | 323/266 |
| 6,710,666 B1 | 3/2004 | Wu et al. | |
| 7,336,112 B1 * | 2/2008 | Sha et al. | 327/158 |
| 7,443,761 B2 * | 10/2008 | Lin | 365/233.1 |
| 8,503,597 B2 * | 8/2013 | Fischette et al. | 375/376 |
| 2003/0025538 A1 | 2/2003 | Bisanti et al. | |
| 2003/0062958 A1 | 4/2003 | Ramet et al. | |
| 2005/0134391 A1 * | 6/2005 | Kimura et al. | 331/16 |
| 2005/0218998 A1 * | 10/2005 | Lim | 331/16 |

(Continued)

FOREIGN PATENT DOCUMENTS

| | | |
|---|---|---|
| EP | 1 471 645 A1 | 4/2004 |
| WO | 02/54597 A2 | 6/2002 |

OTHER PUBLICATIONS

International Search Report in corresponding International Application No. PCT/EP2013/067013 mailed Oct. 18, 2013.

(Continued)

*Primary Examiner* — Adam Houston
(74) *Attorney, Agent, or Firm* — Patent Portfolio Builders PLLC

(57) ABSTRACT

According to embodiments, dual path loop filter circuits are described which have, for example, a single charge pump. The current flow in the DPLF circuit is architected to source, during an injection time period, a first current to the loop filter, sink, also during the injection time period, a second current from the loop filter, wherein the first current has a magnitude of $\alpha*I$ and the second current has a magnitude of $\beta*I$, and sink, during a linearization time period, a third current from the loop filter, wherein the third current has a magnitude of $(\alpha-\beta)*I$.

21 Claims, 12 Drawing Sheets

(56) References Cited

U.S. PATENT DOCUMENTS

| | | | |
|---|---|---|---|
| 2005/0264369 A1* | 12/2005 | Sowlati et al. | 331/17 |
| 2006/0028255 A1* | 2/2006 | Kimura et al. | 327/157 |
| 2006/0132245 A1 | 6/2006 | Dedieu et al. | |
| 2006/0208778 A1* | 9/2006 | Sowlati et al. | 327/157 |
| 2007/0188203 A1* | 8/2007 | Kimura et al. | 327/156 |
| 2007/0195637 A1* | 8/2007 | Lin | 365/233 |
| 2007/0273415 A1* | 11/2007 | Kimura et al. | 327/157 |
| 2007/0298747 A1* | 12/2007 | Wu | 455/260 |
| 2008/0001657 A1* | 1/2008 | Zhang | 327/552 |
| 2008/0042703 A1* | 2/2008 | Sha et al. | 327/158 |
| 2011/0234272 A1* | 9/2011 | Yu | 327/157 |
| 2012/0170699 A1* | 7/2012 | Fischette et al. | 375/376 |
| 2014/0021988 A1* | 1/2014 | Zhang | 327/157 |

OTHER PUBLICATIONS

Written Opinion in corresponding International Application No. PCT/EP2013/067013 mailed Oct. 18, 2013.

Raghavendra, R.G., et al., "Area Efficient Loop Filter Design for Charge Pump Phase Locked Loop," GLSVLSI '07, Mar. 11-13, 2007, Stresa-Lago Maggiore, Italy, ACM 978-1-59593-605-9.

Craninckx, Jan et al., "A Fully Integrated CMOS DCS-1800 Frequency Synthesizer," IEEE Journal of Solid-State Circuits, vol. 33, No. 12, Dec. 1998, Publisher Item Identifier: S 0018-9200(98)08877-5.

Koo, Yido et al., "A Fully Integrated CMOS Frequency Synthesizer with Charge-Averaging Charge Pump and Dual-Path Loop Filter for PCS- and Cellular-CDMA Wireless Systems," IEEE Journal of Solid-State Circuits, vol. 37, No. 5, May 2002, Publisher Item Identifier: S 0018-9200(02)03676-4.

* cited by examiner

DOUBLE OUTPUT LINEARIZED LOW-NOISE CHARGE PUMP WITH LOOP FILTER AREA REDUCTION

RELATED APPLICATIONS

The present application is related to, and claims priority from, European Patent Application No. 12306009.7, filed on Aug. 17, 2012, and U.S. Provisional Patent Application No. 61/696,332 filed on Sep. 4, 2012, the disclosures of which are incorporated herein by reference.

TECHNICAL FIELD

The present invention generally relates to charge pump circuits and, more specifically, to a double charge pump circuit. The present invention finds application in, for example, integrated circuits (ICs) for wireless devices, such as mobile terminal systems (e.g. cell phones, smart phones, etc.), digital media players (e.g. MP3 and MP4 players), DVD player, portable PC, and tablets, etc.

BACKGROUND

Phase Locked Loops (PLL) are widely used in many different applications and domains of the electrical engineering, such as in telecommunications where they are mainly used to synthesize a clock signal or a carrier signal which allows various devices to transpose base band signals to targeted modulation channels. In such applications, for instance, the output signal can be in the High Frequency (HF) or (Radio Frequency) RF domains.

As generally described by the basic PLL chronogram illustrated in FIGS. 1(a)-1(c), a PLL circuit generates an output signal whose phase is related to the phase of a reference signal 100. This output signal is generated by a Voltage Controlled Oscillator (VCO) whose voltage is controlled by the feedback loop. As shown in the top of FIG. 1(a), the VCO phase output signal 102 is divided in order to be compared with the reference phase by a phase frequency differentiator (PFD). A divider generates a divided signal 104 whose frequency value is close to the reference signal 100's frequency value. The PFD generates a signal 106 whose pulse width corresponds to the phase displacement of the reference signal 100 and divided signal 104. The charge pump (CP) sources or sinks a current to the loop filter during the PFD pulse width as indicated by PFD UP signal 106 and PFD DN 108, respectively, and as shown in FIG. 1(b) and described in more detail below.

Loop stabilization and noise filtering are some of the objectives of the loop filter which is adapted to generate the VCO control voltage. Depending on, for example, the applications or the telecommunication standards concerned, the requirements for the PLL may vary, but they usually relate primarily to the same issues. One important PLL design configuration concerns the current consumption of the PLL, which should be as low as possible, especially for mobile devices supplied by batteries. Another design configuration is noise. For example, mobile phone standards like Global Standard for Mobile (GSM) require specific noise values at 400 kHz, which makes it necessary to have a short bandwidth (about 100 kHz for GSM) and thus involves the use of big capacitance values for the loop filter.

Loop filter capacitance can be reduced by the use of a dual path loop filter. As will be further described below, the expected loop filter transfer function can be achieved with a lower silicon area when using two charge pumps, as opposed to a single charge pump in the PLL. Accordingly, existing solutions can be classified into two classes: those with a single path loop filter and those with a dual path loop filter. An example of a PLL architecture based on a single path (single charge pump) loop filter is shown in FIG. 2(a). Therein, and as described above with respect to FIG. 1, a PFD 200 receives both a reference signal 202 and a version of the VCO 204's output signal divided by divider 206 (feedback signal 207). The PFD 200 outputs up/down signals whose pulse width corresponds to the phase displacement of the output signal. The CP 208 sources or sinks a current to the loop filter 210 during the PFD pulse width, and the loop filter 210 outputs the control signal to VCO 204 which, in turn, generates the oscillator signal as shown in FIG. 2(a).

The single path loop filter (SPLF) can be illustrated as shown in the circuit diagram representation of FIG. 2(b). Therein, the single charge pump 220 sources current I to loop filter 230 when the Up switch is closed and the Dn switch is opened and sinks current to the loop filter 230 when the Up switch is opened and the Dn switch is closed. In the single path loop filter architecture of FIGS. 2(a) and 2(b), design attention is paid to improve noise, power consumption and linearity. Linearity defaults mainly occur when the phase of the output of the PLL and the reference phase are synchronized such that the PFD-charge pump combination works alternatively on phase-lead and phase-delay. At steady state, since the PLL locks the VCO output phase on the reference phase, the VCO divided signal edge comes close to the reference edge such that the single charge pump 220 injects no charges to the loop filter 230.

This PLL feedback action is obtained by the UP and DN control signals, e.g., such as those shown in FIG. 1(a) which are generated by the PFD 200 as described above. As seen in FIG. 1(a), the UP signal 106 is a pulse width modulated signal from one edge of the reference signal 100 to the next edge of the VCO divided signal 104. Conversely, the DN signal 108 is a pulse width modulated signal from one edge of the VCO divided signal 104 to the next edge of the reference signal 100 when it comes later.

The charge pump current I in FIG. 2(b) and Iup/Idn in FIG. 1(b) are subject to potential mismatches. Any Iup/Idn mismatch between currents Iup and Idn of the current sources switched by control signals UP and DN, respectively, creates a non-linearity in the charge pump gain characteristic (as shown in FIG. 1(c)) which, in turn, creates undesirable parasitic spurs in the PLL output frequency spectrum. One way to make a more linear single charge pump may be to add a continuous current source at its output, in order to move the steady state into a linear region as shown in FIG. 1(d). However there are some drawbacks to this SPLF solution including: that the loop filter can have a large area due to the short bandwidth; that current leakage by the capacitors related to their size (the thinner the oxide is, the more the capacitor leaks, in particular in newer capacitor technologies), and, significantly, additional noise due to the small but continuous current source used to linearize the charge pump.

More specifically, and looking again at FIG. 2(b), the charge pump 220's current I is sourced in the RC loop filter 230, including an integrator capacitor Ca for noise filtering efficiency, and resistor Rb and capacitor Cb which ensure the loop stability by adding a zero in the PLL transfer function. The capacitors Ca and Cb can be large to optimize PLL noise filtering, implying the need for a large silicon area for these capacitors and correspondingly increasing current leakage through polysilicon capacitor grids.

Alternatively, the same charge pump-loop filter transfer function can be achieved using a smaller capacitance-silicon area if a dual path loop filter architecture is used. An example of this other class of PLL architecture, i.e., the dual path loop filter, which has been developed for loop filter area reduction based on the use of two charge pumps, is shown FIG. 3(a). Therein, elements having similar reference numerals, albeit with a preceding "3" instead of "2", as in FIG. 2(a) operate in a similar manner. It can be seen that the only difference between the PLL of FIG. 2(a) and that of FIG. 3(a) is the provision of two charge pumps 308a and 308b in FIG. 3(a) versus a single charge pump in FIG. 2(a).

A circuit element diagram of an exemplary dual path loop filter (DPLF) is shown in FIG. 3(b). Therein, charge pump current is sourced in an RC loop Filter 310 which includes an integrator capacitor C1 (corresponding to Ca in the example of FIG. 2(b)) for noise filtering efficiency, and resistor R2 (corresponding to Rb in FIG. 2(b)) and capacitor transfer function. In this DPLF architecture, a second charge pump 312 is provided having a nominal current $\beta*I$ which is different from the nominal current $\alpha*I$ of the first charge pump 314. Moreover, to work properly, when one charge pump sources a current, the second charge pump has to sink its counterpart current. A system study has shown that the transfer function associated with an SPLF architecture can be preserved in a DPLF architecture if the capacitance ratio $C_{tot\_dplf}$ in the DPLF system is maintained as:

$$C_{tot\_dplf}=(\alpha-\beta)*C_{tot\_splf} \quad (1)$$

where:
$C_{tot\_dplf}$ represents the total capacitance of dual path loop filter;
$C_{tot\_splf}$ corresponds to the equivalent single path loop filter; and,
$\alpha$ and $\beta$ correspond to the charge pump current ratio relative to a nominal current I.
However, the provision of the second charge pump in a DPLF architecture increases the power consumption of the circuit, increases the noise and also leads to the possibility that charge pump source mismatches can occur. Mismatches can occur both because two charge pumps are used and because the PFD signals UP and DN described above are inverted.

Accordingly, it would be desirable to provide methods, devices and systems which address these, and other, challenges.

BRIEF DESCRIPTION OF THE DRAWINGS

The accompanying drawings illustrate exemplary embodiments, wherein.

ABBREVIATIONS AND ACRONYMS LIST

Figure 1A:
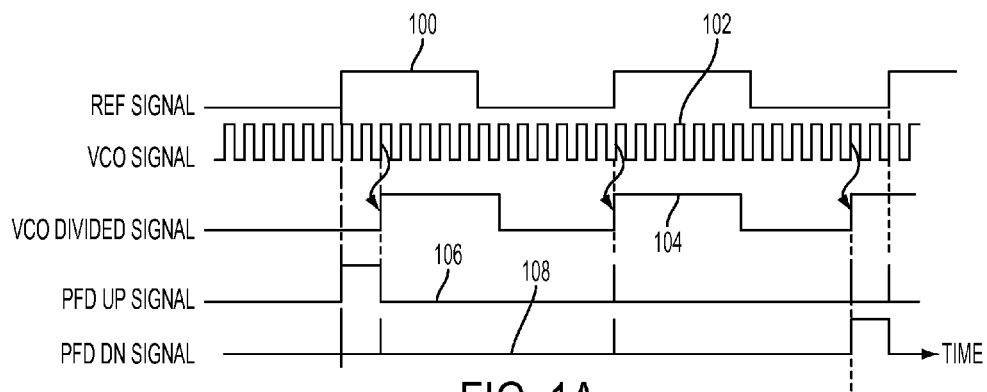
FIGS. 1(a) and 1(b) shows chronograms which illustrate operation of a background PLL.
Figure 1B:
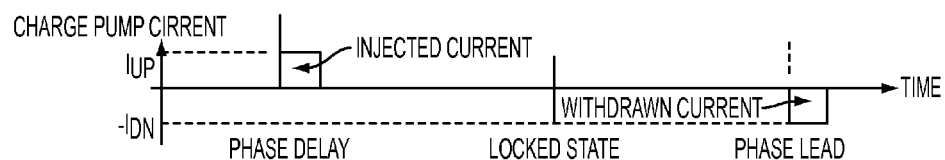
Figure 1C:
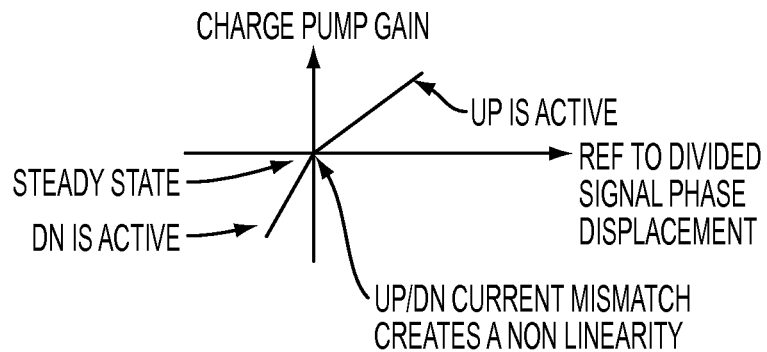
FIGS. 1(c) and 1(d) are graphs illustrating current mismatch associated with background PLLs.
Figure 1D:
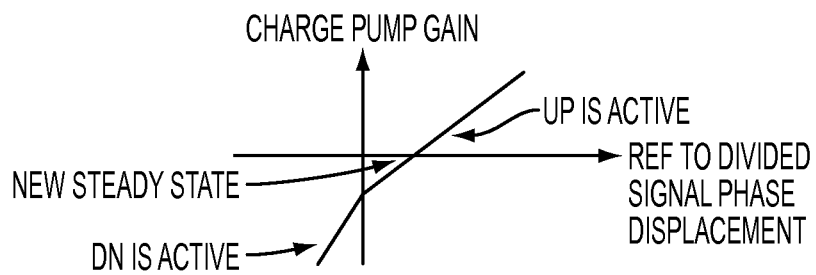
Figure 2A:
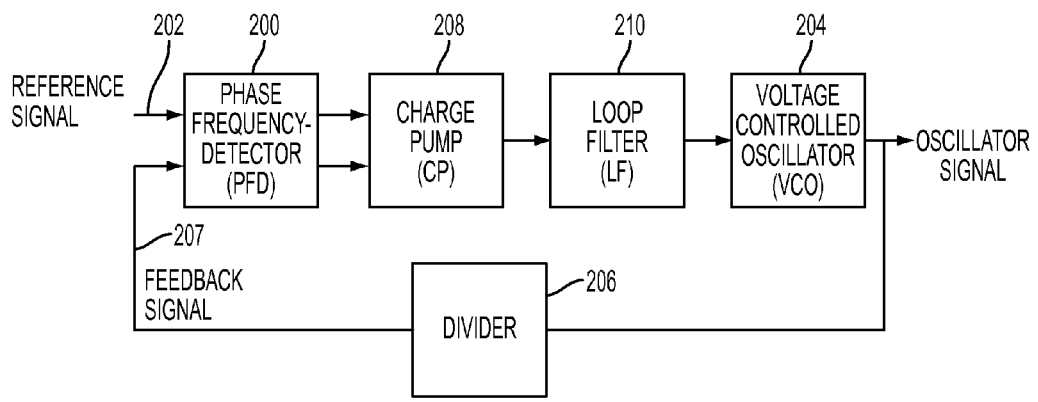
FIG. 2(a) is a block diagram representation of a single path loop filter PLL.
Figure 2B:
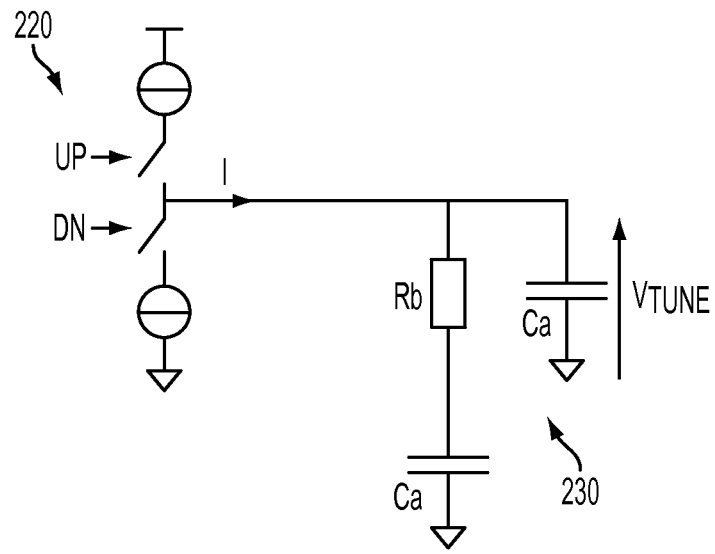
FIG. 2(b) is a circuit diagram representation of same.

CP Charge Pump
DPLF Dual Path Loop Filter
NMOS N-channel Metal Oxide Semiconductor
PLL Phase Lock Loop
PMOS P-channel Metal Oxide Semiconductor
SPLF Single Path Loop Filter
VCO Voltage Controlled Oscillator

SUMMARY

According to an embodiment, a loop filter circuit includes a loop filter having a first capacitor and a second capacitor, and a current source circuit configured to: source, during an injection time period, a first current to the first capacitor of the loop filter; sink, during the injection time period, a second current from the second capacitor of the loop filter, wherein the first current has a magnitude of $\alpha*I$ and the second current has a magnitude of $\beta*I$; and sink, during a linearization time period, a third current from the loop filter, wherein the third current has a magnitude of $(\alpha-\beta)*I$, wherein I is a current having a predetermined magnitude, and $\alpha$ and $\beta$ are constants.

According to another embodiment, a method for sinking and sourcing current to a loop filter includes the steps of: sourcing, during an injection time period, a first current to the loop filter; sinking, during the injection time period, a second current from the loop filter; wherein the first current has a magnitude of $\alpha*I$ and the second current has a magnitude of $\beta*I$; and sinking, during a linearization time period, a third current from the loop filter, wherein the third current has a magnitude of $(\alpha-\beta)*I$, wherein I is a current having a predetermined magnitude, and $\alpha$ and $\beta$ are constants.

According to another embodiment, a phase locked loop (PLL) circuit includes: a loop filter including a first capacitor and a second capacitor, a current source configured to generate a reference current I, a memorization current source circuit configured to generate a source current having a magnitude of $\alpha*I$, and to provide the source current to the first capacitor of the loop filter during an injection time period, and a current mirror circuit configured to receive a first sunk current from the second capacitor during the injection time period having a magnitude of $\beta*I$ and to receive a second sunk current from the loop filter during a linearization time period having a magnitude of $(\alpha-\beta)*I$.

These, and other, embodiments are described in more detail below. Among other things, such embodiments provide for reduced silicon area used by the capacitors in the loop filter circuit and a reduction in current mismatching.

DETAILED DESCRIPTION

The following detailed description of the exemplary embodiments refers to the accompanying drawings. The same reference numbers in different drawings identify the same or similar elements. Also, the following detailed description does not limit the invention. Instead, the scope of the invention is defined by the appended claims.

Reference throughout the specification to "one embodiment" or "an embodiment" means that a particular feature, structure, or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics described herein may be combined in any suitable manner in one or more embodiments.

According to embodiments described herein, it is proposed to take advantage of dual path loop filter architecture, however with the same, or substantially the same, number of components as in the SPLF architecture. Thus embodiments provide, for example, advantages of both architectures without their respective disadvantages. Among other things, embodiments provide a dual path loop filter PLL architecture which enables reducing the semiconductor area of the loop filter by decreasing the values of the capacitances, using for example one well matched charge pump architecture.

More specifically, embodiments described herein provide for a dual charge pump effect (without using two charge pumps) that may be achieved by facing the UP source current to a sink current source split into two parts. This sink current source is not controlled by the DN control signal, which will not generally be used in the embodiments in steady state, but the sink current source is instead controlled by the UP signal for one source and a fixed width pulse for the second source. This fixed width pulse will also improve the charge pump linearity.

Figure 4A:
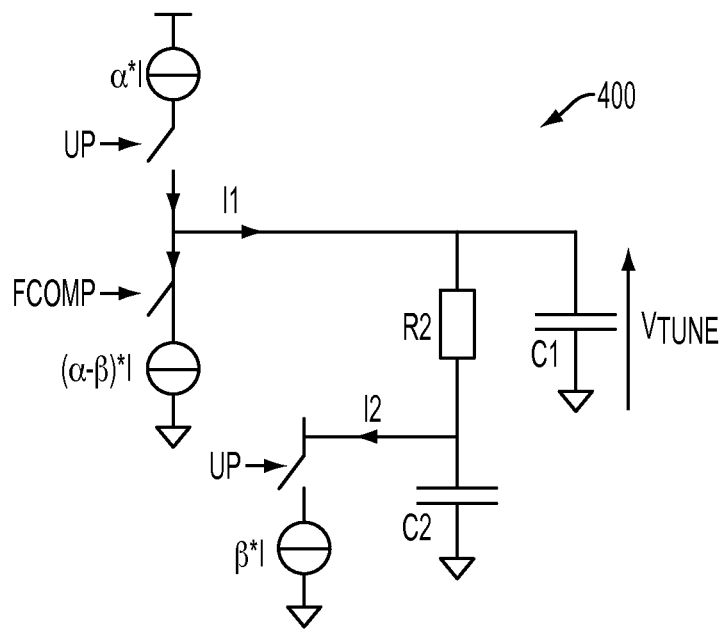
FIG. 4(a) is a circuit diagram representation of a dual path loop filter according to an embodiment.

FIG. 4(a) illustrates a generalized circuit diagram of a dual path loop filter 400 according to an embodiment. Given a supplied current I, the UP control signal sources a current $\alpha*I$ (I1) in the upper portion of the circuit 400, and also sinks a current $\beta*I$ (I2) in the lower portion of the circuit 400 during the measured phase displacement, i.e., the first time period 402 illustrated in the signal timing diagram of FIG. 4(b). Various values can be selected for alpha and beta given the following considerations. Alpha should have a different value than beta. To reduce the size of the capacitor, (alpha-beta) is preferably less than one. If alpha equals one, then power consumption is not increased, however if (alpha-beta) is less than 0.1, then the PLL loop stability and noise can be impacted. During this time, the FCOMP signal is low, such that its corresponding switch is open and no current sinking is occurring at that portion of the circuit 400.

Figure 4B:
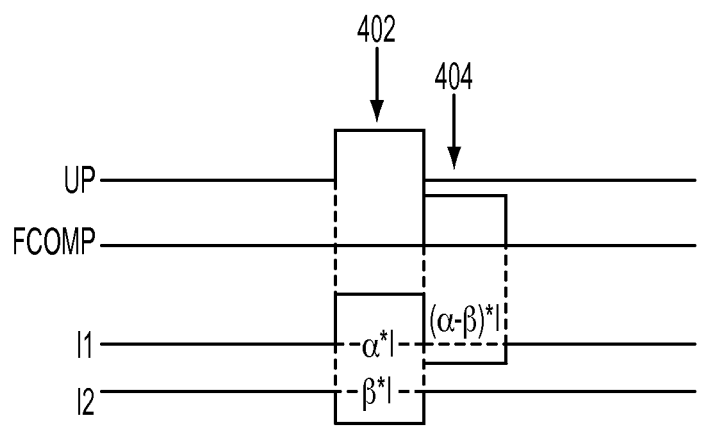
FIG. 4(b) is a signal timing diagram illustrating functional aspects of the embodiment of FIG. 4(a)

During the next time period, i.e., designated 404 in FIG. 4(b), a fixed width pulse signal FCOMP sinks a current of magnitude $(\alpha-\beta)*I$ to balance the charge transfer in the loop circuit 400. During this time period, the UP signal is low, such that the corresponding switches illustrated in FIG. 4(a) are open, and neither I1 nor I2 are flowing in circuit 400. As a result, the PLL phase displacement tends towards the FCOMP pulse width such that the total charges in the loop filter remain constant.

Figure 3A:
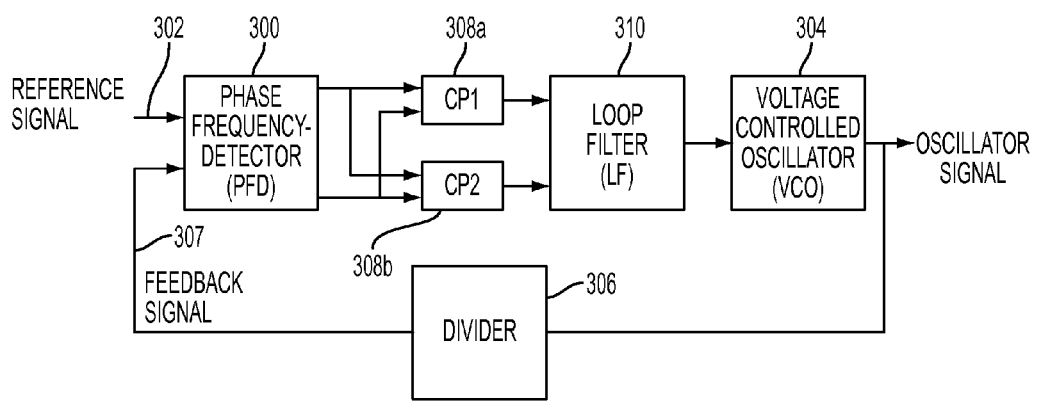
FIG. 3(a) is a block diagram representation of a dual path loop filter PLL.
Figure 3B:
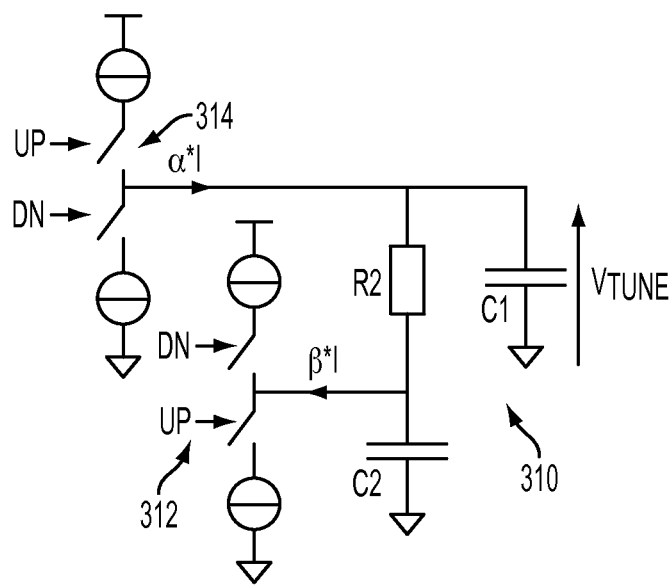
FIG. 3(b) is a circuit diagram representation of same.
Figure 5:
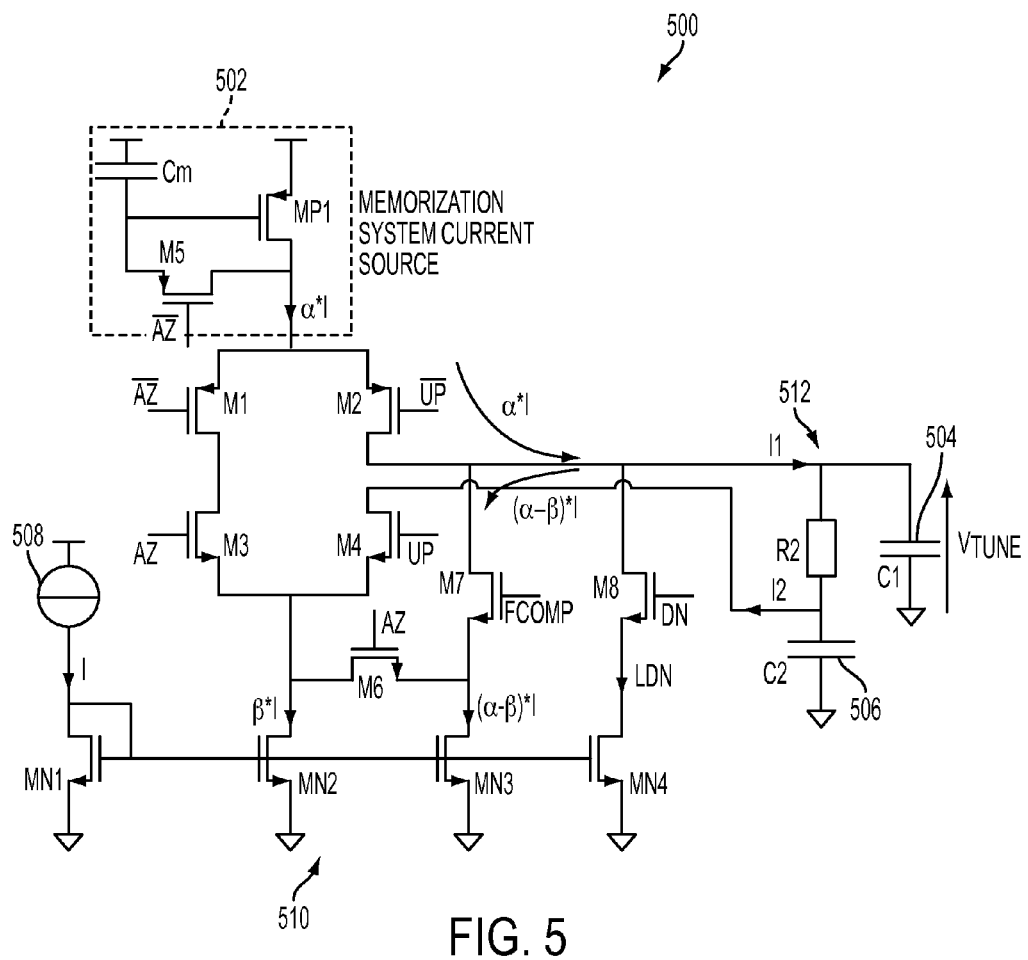
FIG. 5 is an NMOS circuit diagram associated with an embodiment.

FIG. 5 diagrammatically shows an NMOS version 500 of the DPLF architecture according to embodiments. Some general comments will first be provided about this embodiment, followed by more details regarding its operation with respect to FIGS. 6-9. For example, as a general feature, the proposed charge pump architecture 500 has two outputs for both paths of the dual path loop filter, i.e., one path corresponding to I1 at the top of R2 and the second path corresponding to I2 at bottom of R2, as opposed to one output per path for the DPLF of FIG. 3(b). As a result, there is no need to add a second charge pump to use the dual path loop filter 500 and, thus, no second charge pump is used in this embodiment.

As another general comment regarding the operation of DPLF 500 according to this embodiment, for noise and current source matching improvement, a memorization system 502 can be provided which copies the sinking current sources alpha*I (from MN2+MN3) in the sourcing current source MP1. An exemplary implementation of the memorization system 502 is provided in FIG. 5, i.e., comprising the capacitance Cm and the transistors MP1 and M5. It shall be appreciated, however, by those skilled in the art that this system 502 may be realized in different ways, for instance with the use of an amplifier and a reference voltage. For the interested reader, more information regarding the operation of the memorization circuitry 502 can be found in the International Published Patent Application WO 02/054597 entitled "Low-Noise Pump for Phase Locking Loop", dated Jul. 11, 2002, the disclosure of which is incorporated here by reference, albeit this document describes the usage of a memorization circuit in the context of an SPLF architecture.

Additionally, as described in more detail below, linearization of the PLL using the DPLF 500 is obtained by the current being sunk over the time period associated with a fixed width pulse control signal referred to herein as FCOMP in parallel to the DN control signal. The generation of the FCOMP signal can be achieved in different ways, for example, by an inverter delay chain or by using VCO periods. As a result, the FCOMP signal induces an output-reference phase offset due to the loop reaction. Then the locked state of the PLL using the DPLF 500 corresponds to a linear part of the charge pump's gain characteristic. When the PLL using DPLF 500 is locked, charge pump 500 source as many charges as it sinks in the loop filter capacitances, C1 504 and C2 506, whereby the sourced noise is equal to the sunken noise due to the current copy by the memorization system 502.

In one embodiment of the DPLF 500, the AZ signal shown in FIG. 5 may correspond to an output of an OR gate (not shown) having as inputs the signals UP and FCOMP. The current I is a reference current which may be generated by a bandgap circuit 508, for example, or any other current source. The current I is distributed within the DPLF 500 by a current mirror circuit 510 which includes transistors MN1 to MN4. The transistors M1 to M8 operate as switches controlled by the different signals coming from the PFD, i.e., UP, DN, FCOMP and AZ, to source and sink current to the loop filter 512 as described in more detail below with respect to FIGS. 6-9.

According to an embodiment, the DPLF 500 illustrated in FIG. 5 operates in three phases when the PLL in which it is disposed is in its locked or steady state. These three phases are referred to herein as (1) the recopy phase illustrated in FIGS. 6(a) and 6(b), (2) the injection phase illustrated in FIGS. 7(a) and 7(b) and (3) the linearization phase illustrated in FIGS. 8(a) and 8(b).

Figure 6A:
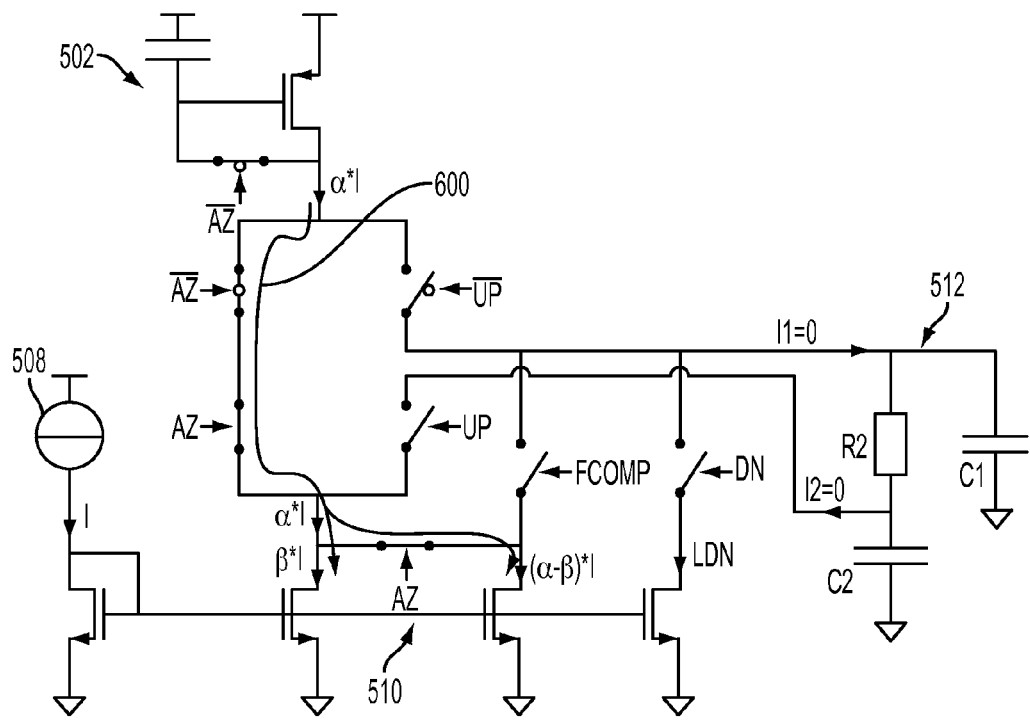
FIGS. 6(a) and 6(b) depict current flow and signal levels, respectively, of the embodiment of FIG. 5 during a recopy phase.
Figure 6B:
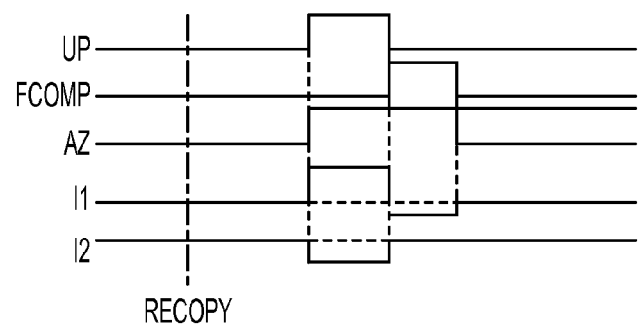
Figure 7A:
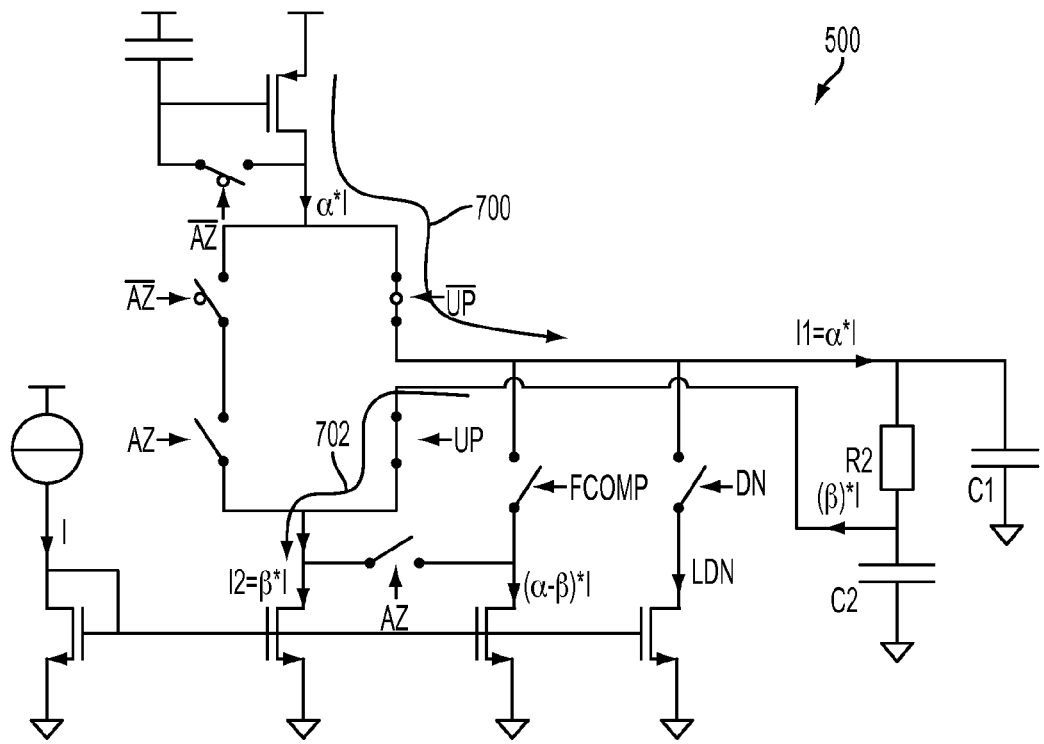
FIGS. 7(a) and 7(b) depict current flow and signal levels, respectively, of the embodiment of FIG. 5 during an injection phase.
Figure 7B:
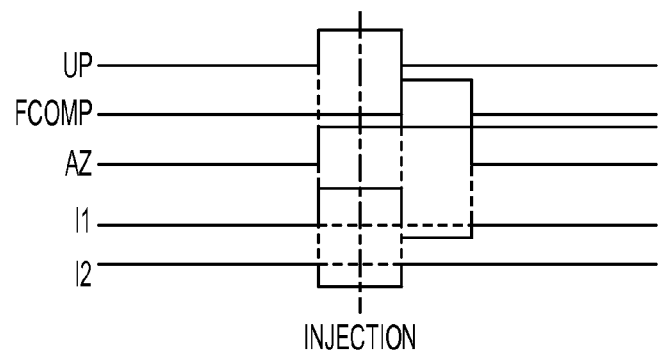
Figure 8A:
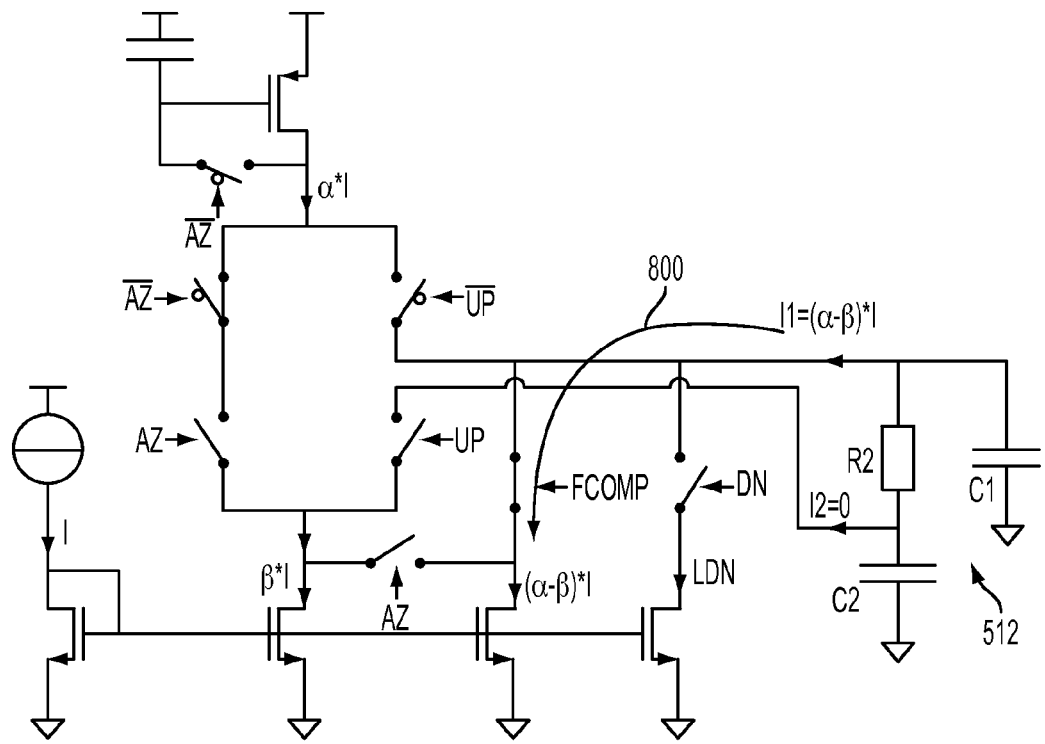
FIGS. 8(a) and 8(b) depict current flow and signal levels, respectively, of the embodiment of FIG. 5 during a linearization phase.
Figure 8B:
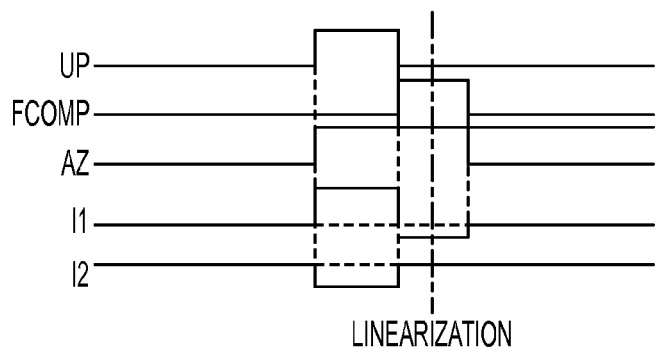

Consider first the recopy phase illustrated in FIG. 6(a). Note that in this figure, as well as FIGS. 7(a) and 8(a), the transistors M1-M8 are replaced by representative switches to better illustrate their open or closed state based on the signal level of their respective control signals. During the recopy phase shown in FIG. 6(a), the largest current used in the DPLF 500, i.e., $\alpha*I$, is recopied into the memorization system 502 using a combination of the two currents $\beta*I$ and $(\alpha-\beta)*I$ generated by current source 508 and current mirror 510 while all of the control signals UP, FCOMP, etc. are inactive, e.g., at the low logic state, as shown in FIG. 6(b). In this way, the transistors which are operating as switches into the loop filter 512 are open such that the loop filter currents I1 and I2 are zero during the recopy phase, i.e., no charges are sourced into, or sunk out of, the loop filter capacitances C1 and C2.

During the second phase, i.e., the injection phase illustrated in FIGS. 7(*a*) and 7(*b*), the DPLF 500 injects the current α*I (represented by arrow 700) into the capacitor C1 along the upper path. This is accomplished by changing the control signals to have the values shown in FIG. 7(*b*) such that the transistors M1-M8 open and close as shown by their corresponding switches in FIG. 7(*a*). This current injection occurs for the time period associated with the length of the UP control signal, i.e., as long as the UP signal is active (for instance at the high logic state in the example of FIG. 7(*b*). During this same time period, the DPLF 500 (or its charge pump) sinks the current β*I from capacitor C2 along the lower path of the DPLF 500 (as shown by the arrow 702).

In the third phase, referred to herein as the linearization phase and illustrated in FIGS. 8(*a*) and 8(*b*), the charge pump sinks the current (α−β)*I, as shown by arrow 800, from the capacitor C1 during the length of the FCOMP signal, i.e., as long as this signal is in the active state which in this example is a logical high value. According to an embodiment, this length is kept constant in order to maintain injection at the steady state. By using this type of linearization phase, the same current has been sourced and sunk in the loop filter 512 during one period of the reference signal.

Figure 9A:
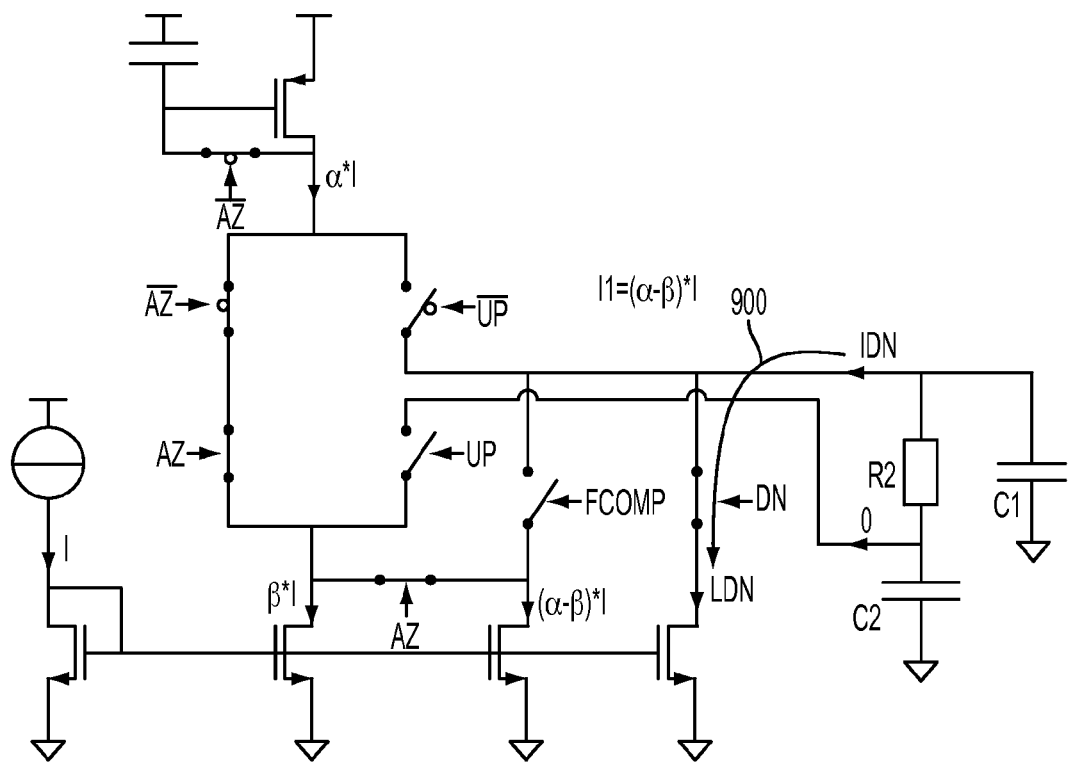
FIGS. 9(a) and 9(b) depict current flow and signal levels of the embodiment of FIG. 5 during a tracking phase.
Figure 9B:
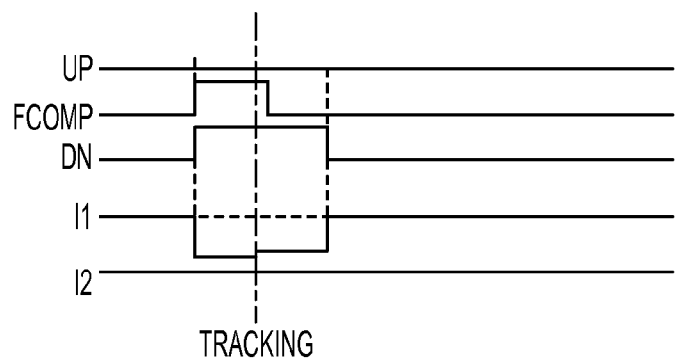

Note that the three phases described above associated with the DPLF embodiment of FIG. 5, i.e., the recopy, injection and linearization phases, are steady state phases associated with PLLs according to embodiments which incorporate a DPLF 500. However, an additional, optional phase, illustrated in FIGS. 9(*a*) and 9(*b*) and referred to herein as a tracking phase, can be used to obtain steady state during the locking phase of the PLL. This may be achieved by, for example, sinking a current Idn (as shown by the arrow 900 in FIG. 9(*a*)) from capacitor C1. In order to achieve this current flow, the control signal values can be set as shown in FIG. 9(*b*).

Figure 10:
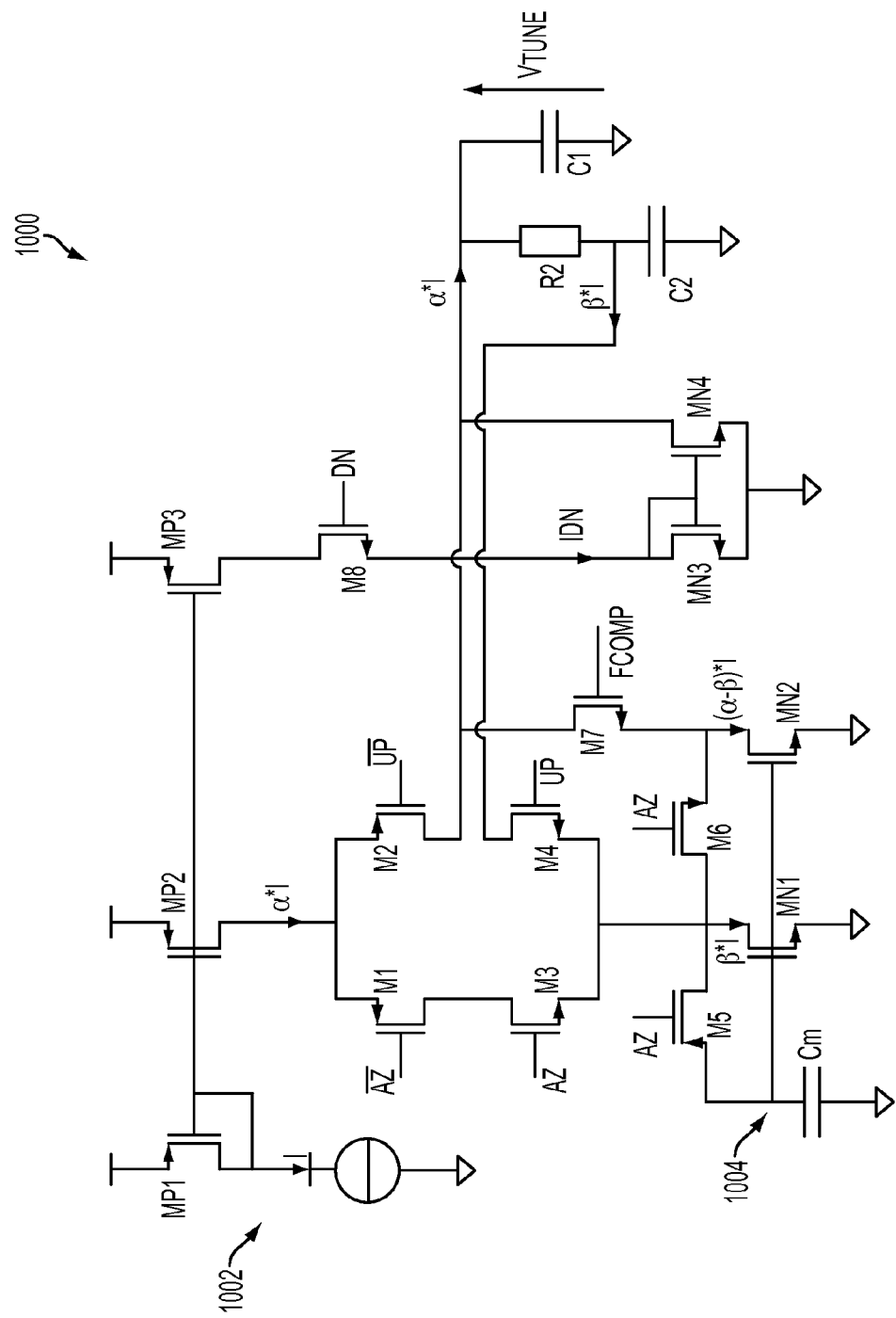
FIG. 10 illustrates a PMOS version of a dual path loop filter according to an embodiment.

FIG. 10 shows another DPLF embodiment which is a PMOS implementation 1000 as opposed to the NMOS implementation 500 of FIG. 5. Thus, the circuit structure 1000 is inversed compared to that of DPLF 500 in FIG. 5. For example, the current sources derived from reference current source I 1002 are disposed at the top of circuit 1000 as shown by the transistors MP1 to MP3. The memorization system 1004 is, in this embodiment, found in the lower left hand portion of the circuit 1000 and includes capacitor Cm and the transistors MN1 and MN2 for the current source, and transistors M5 and M6 as switches commanded by the signal AZ. Another difference between DPLF 500 and DPLF 1000 according to these embodiments involves the path of the current Id used during the aforedescribed tracking phase. In order to sink this current from the capacitor C1 in DPLF 1000, a current mirror made by the transistors MN3 and MN4 is provided.

Despite these noted differences between DPLF 500 and DPLF 1000, DPLF 1000 shown in FIG. 10 generally operates in the same manner as DPLF 500, including the various phases of operation described above and, therefore such operation is not redundantly repeated here. For example, both embodiments combine the advantages of a dual path loop filter and a linearized charge pump with memorization without the disadvantages of each one. One such advantage is that, for the same PLL function transfer, the DPLF 500 or 1000 occupies a smaller silicon area on the chip than using an SPLF architecture due to the reduced amount of capacitance needed for the loop filter and the use of only one charge pump. Moreover, the ability to use a smaller capacitance value could allow for the use of only metal capacitors and/or only thick oxide polysilicon capacitors, the latter of which is worse from a density perspective, but better from the perspective of leakage current. Alternatively, because the polysilicon devices' capacitance value depends on its output voltage, the linearity is better for the metal capacitor making it a better choice for some implementations. Moreover, embodiments described herein can also be implemented using bipolar devices.

Additionally, the aforedescribed DPLF embodiments having a single charge pump don't increase current consumption as compared to the existing solutions with two different charge pumps. Using a charge pump with memorization according to some embodiments, enables a good recopying of the noise current, so that DPLFs 500 and 1000 do not generate additional noise compared to existing SPLFs and generate less noise than existing DPLFs. Yet another advantage resulting from this architecture is a good matching between the two currents, unlike the architecture with two charge pumps.

Figure 11A:
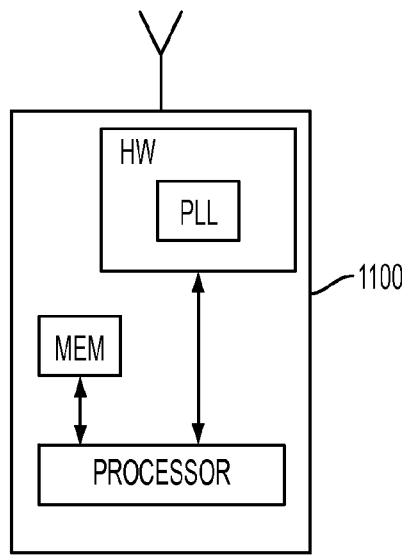
FIGS. 11(a) and 11(b) depict examples of devices in which PLLs according to these embodiments can be implemented.
Figure 11B:
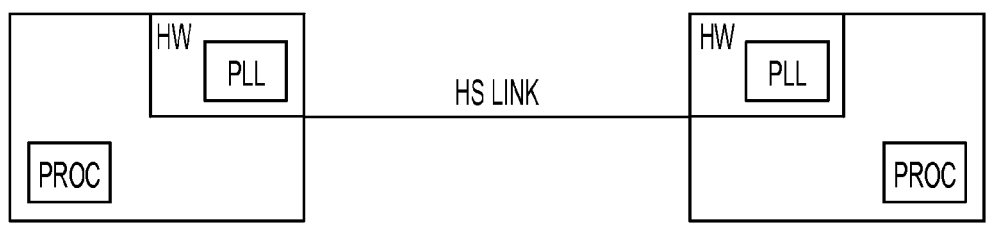

This solution can be implemented in any type of PLL for any application including, but not limited to, clock recovery, frequency synthesizers, digital clock generators, etc. In radiofrequency PLLs used for wireless communications, for instance, the loop filter area typically corresponds to approximately 20% of the total PLL control loop chip area including digital and power management. Moreover, considering PLLs used for high speed digital links, the charge pump and loop filter typically occupies up to half the full PLL area. Thus, in such exemplary applications, significant silicon area can be saved by using DPLFs such as those described herein. This is generally illustrated in FIGS. 11(*a*) and 11(*b*), which shows a device 1100, e.g., a user equipment, which includes a processor, memory unit, and hardware (HW) including a PLL having a DPLF 500 or 1000, and a system 1102 having a high speed (HS) link supported by a PLL in either connected device each having a DPLF 500 or 1000. Generally speaking, such devices can thus include a processor configured to generate communication signals, a memory device configured to store program instructions and connected to the processor and a phase locked loop for generating time signals for the device and having a loop filter circuit, such as those described above.

Moreover, technology evolutions reduce MOS grid thickness and, thus, grid to ground current leakages increase. Due to the loop filter's typically large capacitance chip area, current leakage increases PLL static phase error which in turn increases phase noise. These embodiments, however, enable a reduction in the loop filter capacitance area by more than a factor of two. Thus, these embodiments will be helpful for future low cost products, especially for mobile applications in telecommunications.

Figure 12:
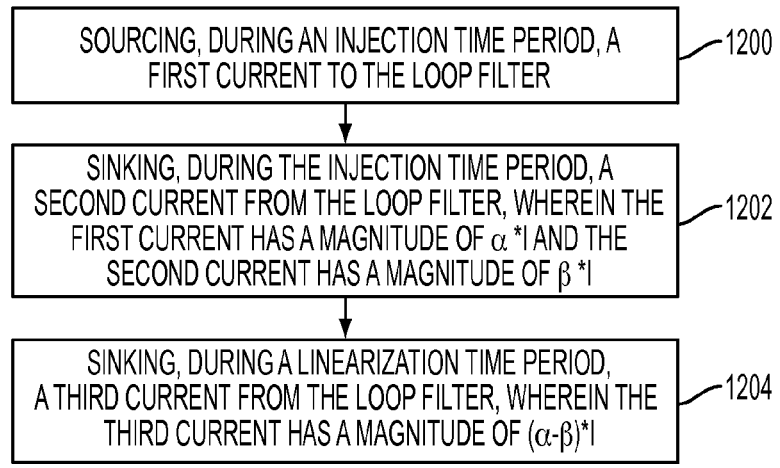
FIG. 12 is a flow diagram illustrating a method according to an embodiment.

Based on the foregoing, a method for sinking and sourcing current to a loop filter according to an embodiment can include the steps illustrated in the flow diagram of FIG. 12. Therein, at step 1200, a first current is sourced to the loop filter during an injection time period. Also, during the injection time period, a second current is sunk from the loop filter, as shown by step 1202. The first current has a magnitude of α*I and the second current has a magnitude of β*I. Then, at step 1204, a third current is sunk from the loop filter sinking during a linearization time period, wherein the third current has a magnitude of (α−β)*I. I is a current having a predetermined magnitude, and α and β are constants.

Moreover, it will also be appreciated that, according to one or more embodiments, a phase locked loop (PLL) circuit can include: a loop filter including a first capacitor and a second capacitor, a current source configured to generate a reference current I, a memorization current source circuit configured to generate a source current having a magnitude of α*I, and to provide the source current to the first capacitor of the loop filter during an injection time period, and a current mirror circuit configured to receive a first sunk current from the second capacitor during the injection time period having a magnitude of β*I and to receive a second sunk current from the loop filter during a linearization time period having a magnitude of (α−β)*I.

In addition to those advantages mentioned above, various embodiments may also provide one or more of the following advantages or benefits:
- good linearity;
- low noise: only one charge pump noise and current memorization;
- reduced capacitor area;
- low current leakage in the capacitors;
- solving disadvantages of previous architectures, namely:
  - no DC current needed for second charge pump output biasing;
  - no fine tuning: low mismatches between alpha and beta current due to the memorization As used herein, expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa. While there has been illustrated and described various embodiments of the present invention, it will be understood by those skilled in the art that various other embodiments and modifications may be made, and equivalents may be substituted, without departing from the true scope of the present invention. Additionally, many modifications may be made to adapt a particular situation to the teachings of the present invention without departing from the concepts described herein. Furthermore, an embodiment of the present invention may not include all of the features described above. Therefore, it is intended that the present invention not be limited to the particular embodiments disclosed, but that the invention include all embodiments falling within the scope of the invention as broadly defined above. A person skilled in the art will readily appreciate that various parameters disclosed in the description may be modified and that various embodiments disclosed and/or claimed may be combined without departing from the scope of the invention.

The above-described exemplary embodiments are intended to be illustrative in all respects, rather than restrictive, of the present invention. Thus the present invention is capable of many variations in detailed implementation that can be derived from the description contained herein by a person skilled in the art. No element, act, or instruction used in the description of the present application should be construed as critical or essential to the invention unless explicitly described as such. Also, as used herein, the article "a" is intended to include one or more items.

The invention claimed is:

1. A loop filter circuit comprising:
a loop filter including a first capacitor and a second capacitor; and
a current source circuit configured to:
 (a) source, during an injection time period, a first current to the first capacitor of the loop filter;
 (b) sink, during the injection time period, a second current from the second capacitor of the loop filter, wherein the first current has a magnitude of α*I and the second current has a magnitude of β*I; and
 (c) sink, during a linearization time period, a third current from the loop filter, wherein the third current has a magnitude of (α−β)*I,
wherein I is a current having a predetermined magnitude, and α and β are constants.

2. The loop filter circuit of claim 1, wherein the loop filter circuit is a dual path loop filter (DPLF) having only a single charge pump.

3. The loop filter circuit of claim 2, wherein the single charge pump is linearized during the linearization time period.

4. The loop filter circuit of claim 1, further comprising:
a memorization circuit configured to copy the first current during a recopy time period in order to reduce noise.

5. The loop filter circuit of claim 1, wherein the current source circuit includes a single current source configured to generate a reference current I and a current mirror circuit configured to generate the first, second and third currents using the reference current I.

6. The loop filter circuit of claim 1, wherein a length of the linearization time period is constant.

7. The loop filter circuit of claim 1, wherein the current source circuit is further configured to sink, during a tracking phase, a fourth current from the first capacitor.

8. A method for sinking and sourcing current to a loop filter comprising:
sourcing, during an injection time period, a first current to the loop filter;
sinking, during the injection time period, a second current from the loop filter;
 wherein the first current has a magnitude of α*I and the second current has a magnitude of β*I; and
sinking, during a linearization time period, a third current from the loop filter,
 wherein the third current has a magnitude of (α−β)*I,
 wherein I is a current having a predetermined magnitude, and α and β are constants.

9. The method of claim 8, wherein the loop filter circuit is a dual path loop filter (DPLF) having only a single charge pump.

10. The method of claim 8, wherein the single charge pump is linearized due to the linearization time period.

11. The method of claim 8, further comprising:
copying the first current during a recopy time period in order to reduce noise.

12. The method of claim 8, further comprising:
generating a reference current I using a single current source; and
generating the first, second and third currents using the reference current I and a current mirror.

13. The method of claim 8, wherein a length of the linearization time period is constant.

14. The method of claim 8, wherein a length of the linearization time period is proportional to a VCO period.

15. The method of claim 8, further comprising:
sinking, during a tracking time period, a fourth current from the loop filter.

16. A phase locked loop (PLL) circuit comprising:
a loop filter including a first capacitor and a second capacitor;
a current source configured to generate a reference current I;
a memorization current source circuit configured to generate a source current having a magnitude of α*I, and to provide the source current to the first capacitor of the loop filter during an injection time period;

a current mirror circuit configured to receive a first sunk current from the second capacitor during the injection time period having a magnitude of $\beta *I$ and to receive a second sunk current from the loop filter during a linearization time period having a magnitude of $(\alpha-\beta)*I$.

17. The PLL circuit of claim 16, wherein the loop filter circuit is a dual path loop filter (DPLF) having only a single charge pump.

18. The PLL circuit of claim 17, wherein the single charge pump is linearized during the linearization time period.

19. The PLL circuit of claim 16, wherein the memorization circuit is further configured to copy the source current during a recopy time period in order to reduce noise.

20. The PLL circuit of claim 16, wherein a length of the linearization time period is constant.

21. The PLL circuit of claim 16, wherein a length of the linearization time period is proportional to a VCO period.

* * * * *